United States Patent [19]

Longerich et al.

[11] Patent Number: 4,922,381
[45] Date of Patent: May 1, 1990

[54] STACKED CIRCUIT CARDS AND GUIDED CONFIGURATIONS

[75] Inventors: Ernest P. Longerich, Chatsworth; Saverio A. D'Agostino, Camarillo, both of Calif.

[73] Assignee: Hughes Aircraft Company, Los Angeles, Calif.

[21] Appl. No.: 843,965

[22] Filed: Mar. 25, 1986

[51] Int. Cl.$^5$ .......................... H05K 1/11; H05K 1/14
[52] U.S. Cl. .................................... 361/414; 102/293; 361/381
[58] Field of Search ............... 361/412, 413, 414, 415, 361/380, 381, 385, 394, 395

[56] References Cited

U.S. PATENT DOCUMENTS

| | | | |
|---|---|---|---|
| 2,752,537 | 6/1956 | Wolfe | 361/414 |
| 2,958,014 | 10/1960 | Blain | 361/415 |
| 2,976,806 | 3/1961 | Risk et al. | 361/394 |
| 3,081,416 | 3/1963 | Tuttle et al. | 361/414 X |
| 3,139,559 | 6/1964 | Heidler | 361/394 |
| 3,434,014 | 3/1969 | Taynton | 361/412 X |
| 3,596,140 | 7/1971 | Walsh | 361/412 |
| 3,818,280 | 6/1974 | Smith et al. | 361/415 X |
| 3,904,934 | 9/1975 | Martin | 361/412 |
| 3,999,105 | 12/1976 | Archey et al. | 361/385 |
| 4,051,414 | 9/1977 | Will et al. | 361/415 |
| 4,283,754 | 8/1981 | Parks | 361/382 |
| 4,399,488 | 8/1983 | Ruwe et al. | 361/412 |
| 4,520,427 | 5/1985 | Brotherton | 361/394 X |

FOREIGN PATENT DOCUMENTS 683040 8/1979 U.S.S.R. .............................. 361/395

OTHER PUBLICATIONS

Ciccio et al, Ultra–High Density VLSI Modules, Proceedings of the 28th Electronics Components Conf., Anaheim, Calif., U.S.A., Apr. 1978, pp. 244 to 252.

*Primary Examiner*—Charles T. Jordan
*Attorney, Agent, or Firm*—Robert A. Hays; Michael W. Sales; W. K. Denson-Low

[57] ABSTRACT

A configuration of an electronics unit is disclosed wherein a plurality of circular circuit cards are arranged in an aligned, parallel relationship. Each card has a central circular inner opening formed therein. A plurality of inner and outer spacer elements support the respective inner and outer peripheries of the cards. The conductive patterns on the cards include a plurality of conductive pads arranged around the inner and outer peripheries of the cards. Circular metal-on-elastomer inner and outer connectors engage respective one of the inner and outer spacers, and the metal traces of the connectors make electrical contact with aligned conductive pads of adjacent cards. The unit includes a cover structure which envelopes the circuit card configuration to form a sealed unit, and an electrically insulating coolant liquid is disposed in the sealed unit in direct contact with the circuit cards and electrical components mounted thereon to absorb heat generated by electrical power dissipation. The electronics unit is particularly well suited to use with a guided vehicle configuration, such as a missile, wherein a tubular center structural member extends forwardly from the aft missile body, and the electronics unit is assembled with the tubular member extending through the central opening in the electronics unit. The sensor platform of the missile receives the tubular support member through a central opening. The sensor platform is secured by a fastener exerting compression forces along the central missile axis, thereby also aligning the sensor platform with the aft missile body containing the missile propulsion system.

1 Claim, 7 Drawing Sheets

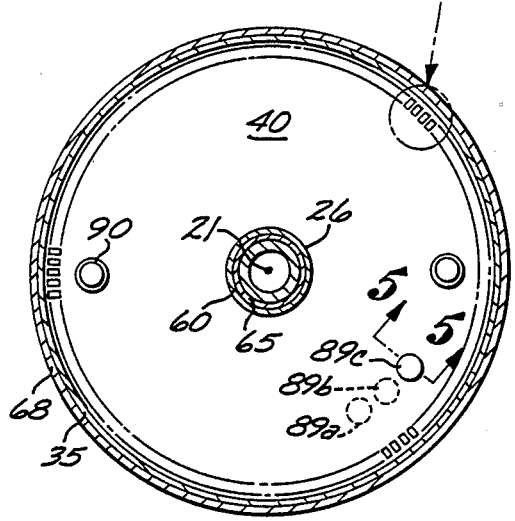
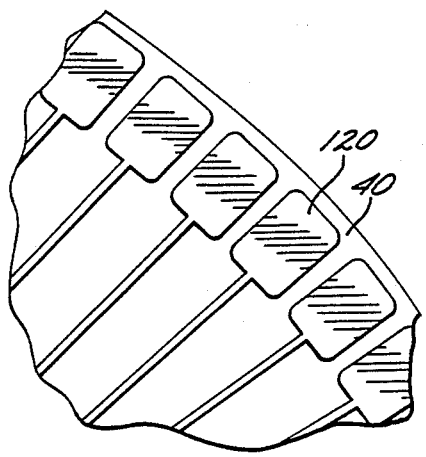
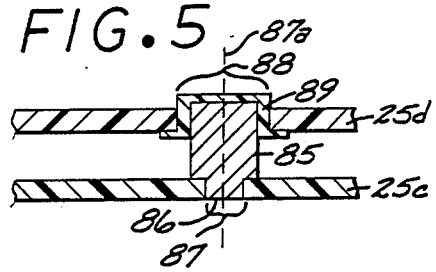
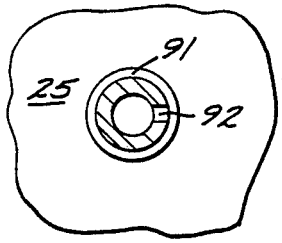

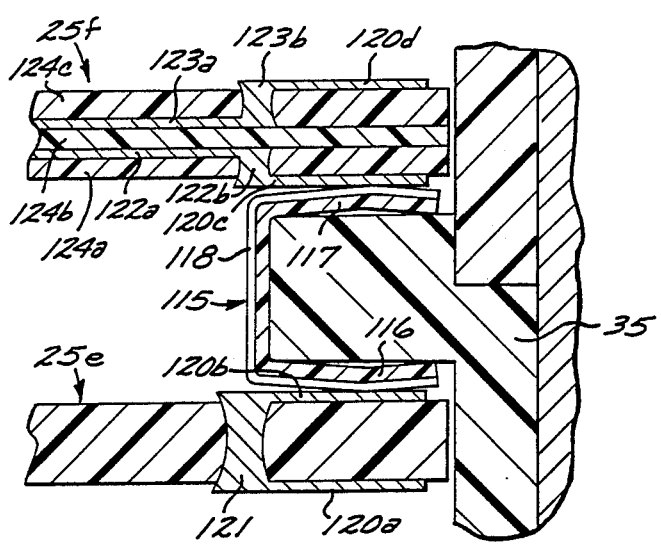
FIG. 6
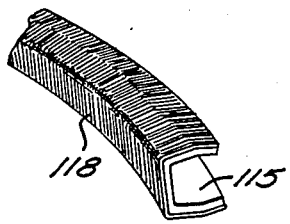
FIG. 7
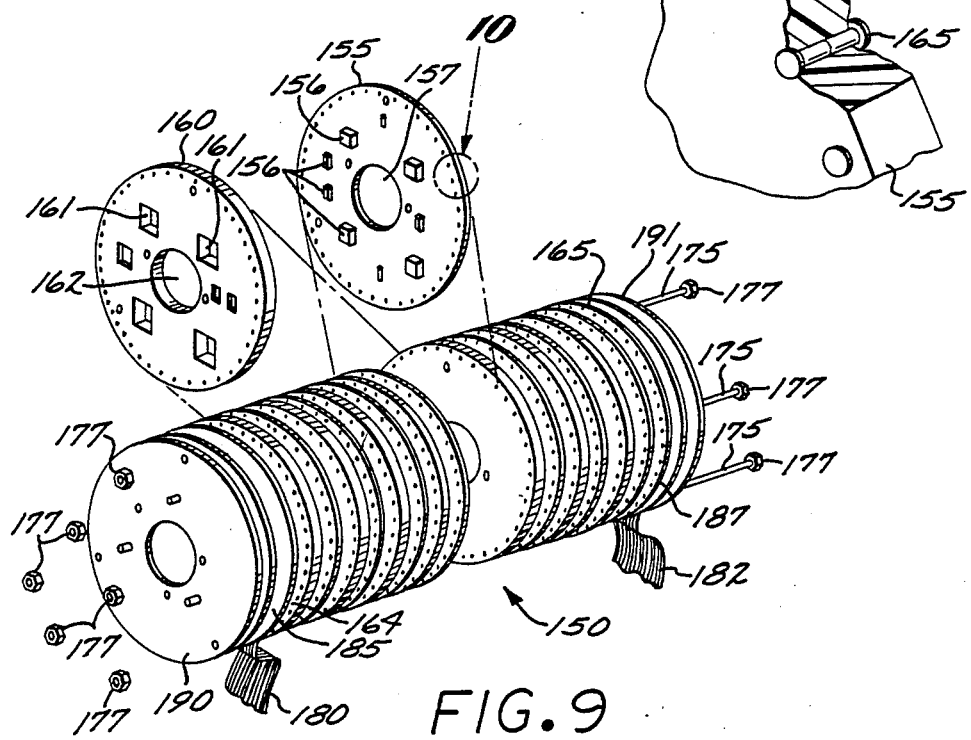
FIG. 10
FIG. 9

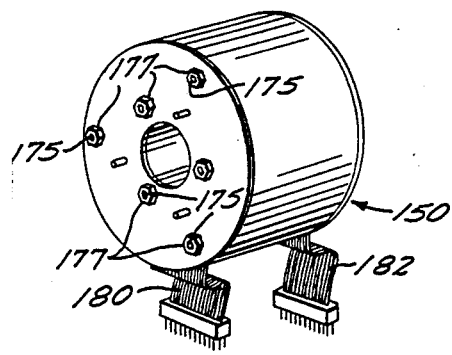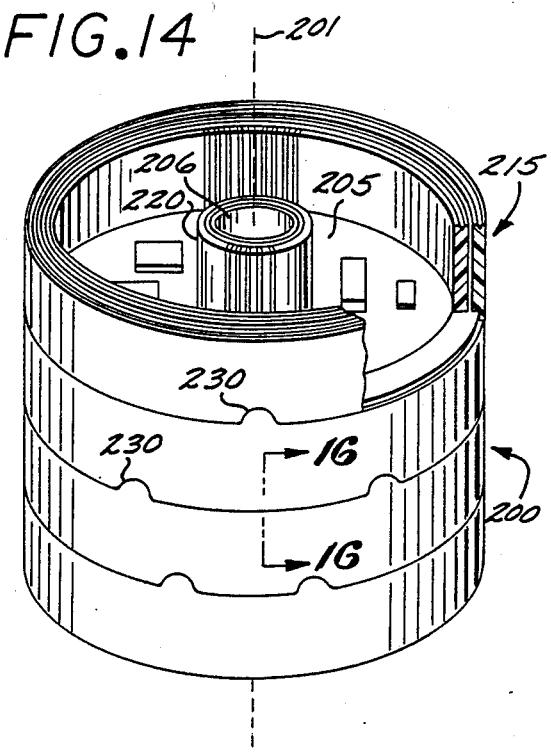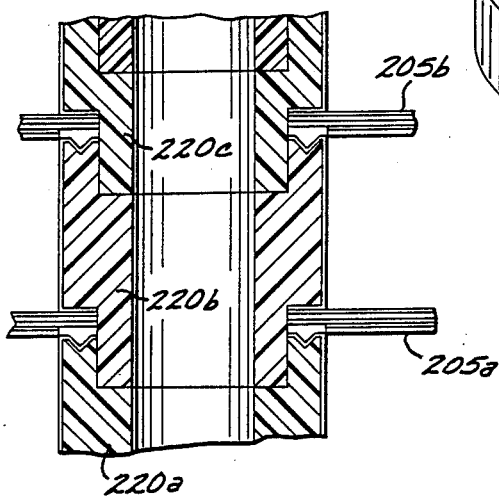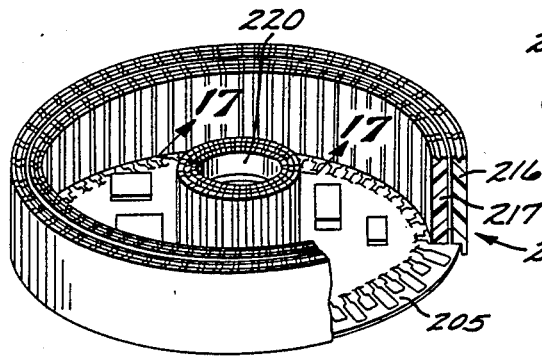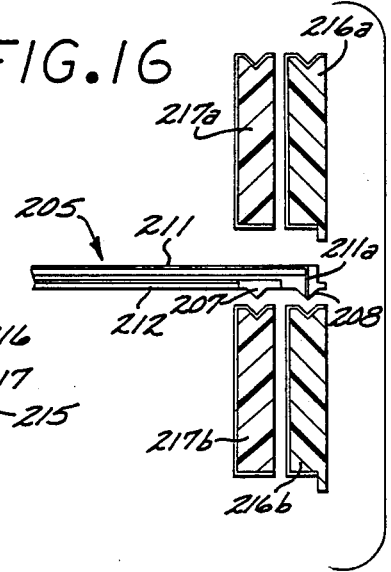

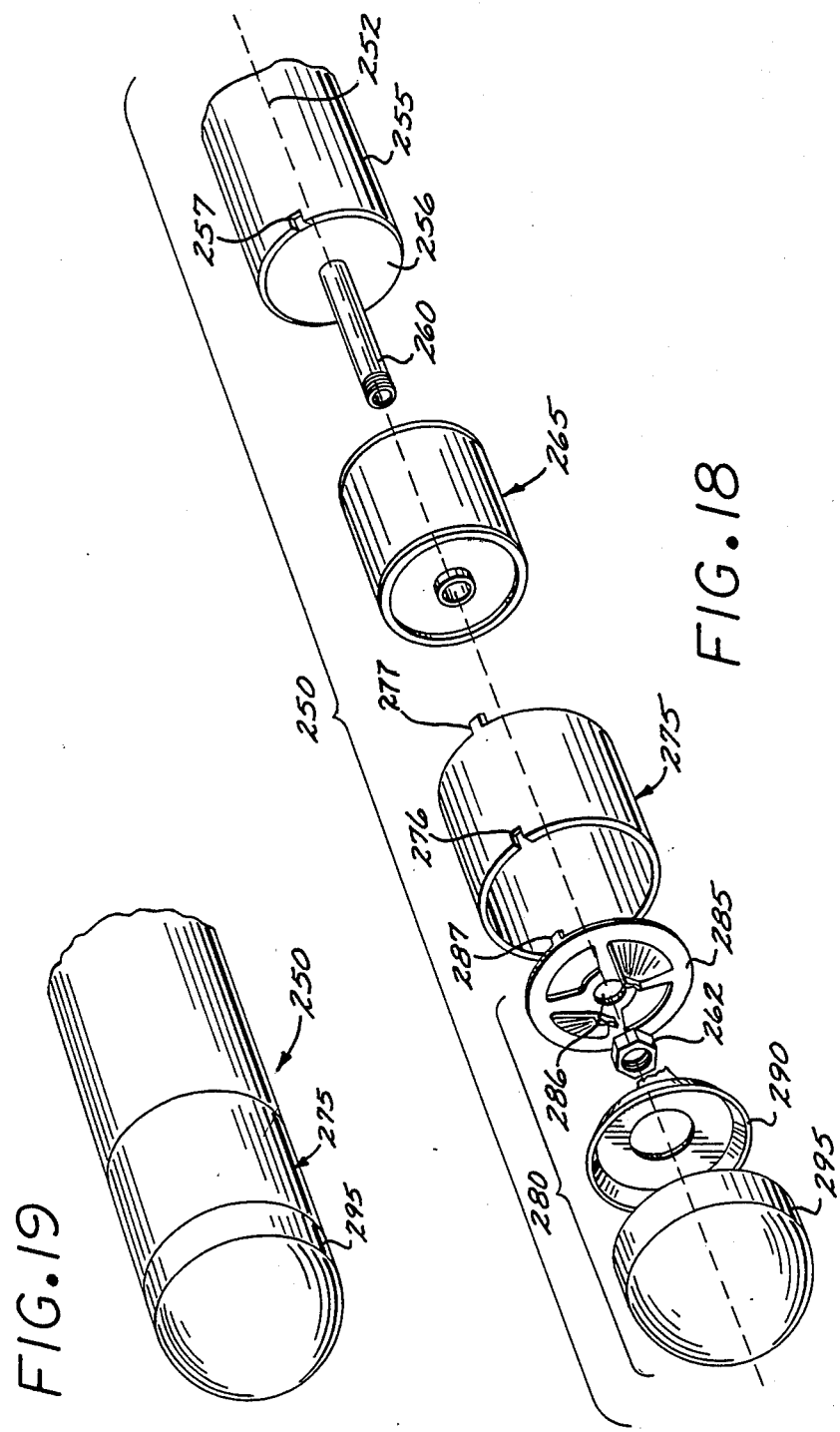

STACKED CIRCUIT CARDS AND GUIDED CONFIGURATIONS

BACKGROUND OF THE INVENTION

The present invention relates to multiple circuit card configurations which provide efficient space utilization, electrical continuity between adjacent circuit boards and cooling of the electrical components mounted on the cards for such applications as missile electronics units.

For most applications, the size of the electrical circuit cards on which the electrical components are mounted in an electronics unit is limited by packaging constraints and the like. As a result, multiple circuit boards or cards are employed in close-packed arrangements. One such application is that of guided vehicles, such as missiles or torpedos, wherein the guidance electronics unit is packaged within the relatively narrow tubular configuration of the vehicle body. A number of circuit cards are typically employed to comprise the electronics unit. In conventional arrangements, multiple pin connectors are located on one edge of each circuit card. These connectors are then mated to matching connectors on a "motherboard" which provides a means to electrically couple power and signals between the various cards. For missiles, the motherboard is typically aligned parallel to but offset from the longitudinal axis of the missile, with the circuit cards being arranged perpendicular to the longitudinal axis of the missile. The motherboard is supported by elongated rails extending along the missile sides, and the circuit cards are supported by the connectors and by card guides secured to the rails. A significant disadvantage of this approach is that the number of connector pins is limited by the confined area, and the assembly and testing operations are necessarily complex. The configuration also wastes much of the available space, and the pin connectors required are quite expensive. Moreover, the configuration is not conducive to reliable operation in applications wherein the circuit card arrangement is subjected to high G forces.

The electronics sections of missiles are typically exposed to high G forces, and the circuit cards, connectors and related hardware must be structurally adapted and secured to withstand such forces while providing satisfactory electrical performance. Because the circuitry is typically arranged in a plurality of closely packed boards with relatively high power output, severe heat dissipation requirements are also common.

Two approaches have been used in the past to meet the severe heat dissipation requirements of missile electronics units. Both approaches employ ceramic circuit cards which are difficult to repair and are easily damaged in removal. The first involves an active cooling technique wherein a fluid is circulated through a plate on which the circuit card is mounted. This approach requires a complex cooling system, and conventionally depends upon bonding of frangible ceramic cards to the coolant plate to provide the necessary thermal conductivity. The cooling achieved by this approach is typically not uniform, the bonds do not provide high heat conductivity, and repair is difficult. The second approach is to provide passive cooling to the ceramic cards by bonding them to metallic heat sinks, typically aluminum. This approach also has the drawbacks of non-uniform cooling, low conductivity of the bonds, and difficulty of repair, and in addition is highly weight inefficient.

In conventional guided vehicle or missile configurations, the seeker platform supporting the seeker elements is located at the forward region of the missile, and is separated from the aft missile body by the electronics unit. The boresight of the seeker platform must be properly aligned with the aft missile body to provide accurate missile guidance and control. The alignment is typically achieved by mechanical means, such as shimming the platform as it is secured to the structural rails to achieve a parallel alignment between the platform and a corresponding parallel surface of the aft missile section, while the assembled missile is mounted on a test fixture for optical or RF measurements. The alignment procedure is time consuming and adds significantly to the cost of the missile assembly.

It would therefore represent an advance in the art to provide a circuit board configuration which provides a simple, low cost means of interconnecting multiple cards in an electronics unit without the use of conventional pin connectors, while providing an increased circuit board area.

It would further be advantageous to provide a multiple circuit card configuration which provides a simple and low cost means for cooling the electrical components mounted on the circuit cards.

It would further be advantageous to provide a guided vehicle configuration which substantially eliminates the need for expensive boresighting tests and procedures to align the seeker platform with the aft vehicle body.

SUMMARY OF THE INVENTION

An improved circuit card configuration is disclosed. The configuration includes a plurality of stacked circuit cards, each having a central opening formed therein. Each card has an electrically conductive pattern formed thereon, including a plurality of conductive pads disposed on each side of the card adjacent the inner and outer peripheral edges. Means are provided for supporting the respective inner and outer peripheral edges of the circuit cards so that the cards are in a stacked, parallel relationship. A plurality of inner and outer metal-on-elastomer connectors are arranged to respectively connect corresponding conductive pads of adjacent peripheral edges of the circuit cards and to electrically connect the stacked circuit cards. In accordance with one aspect of the invention, the inner conductors are employed to provide electrical power to the circuit cards, and the outer connectors are employed to couple time-varying or information signals between the cards, thereby isolating power and signal lines.

In accordance with another aspect of the invention, means are provided for enclosing and sealing the circuit cards to form a sealed unit. A coolant fluid is disposed within the sealed unit in contact with the circuit cards and the electrical components populating the circuit cards. The coolant fluid absorbs heat from the components and circuit cards and comprises a passive cooling system.

A further aspect of the invention is a new guided vehicle configuration, such as a missile or torpedo, for carrying an electronics unit such as the circuit card configuration described above. The configuration includes a substantially cylindrical aft vehicle section carrying the vehicle propulsion system. A tubular center structural member is secured to the aft section and extends forwardly therefrom. A tubular vehicle outer cover member is provided. A vehicle electronics unit fits within the outer cover member and has a central opening formed therein, the electronics unit being assembled with the tubular structural member extending through the central opening formed therein. The forward sensor section of the vehicle includes a sensor platform with a central opening formed therein. These various components of the vehicle are assembled together, with the tubular support member extending through the respective openings in the electronics unit and the sensor platform. A fastener coupled to the forward end of the central tubular support is used to secure the assembled components in position.

BRIEF DESCRIPTION OF THE DRAWINGS

These and other features and advantages of the present invention will become more apparent from the following detailed description of exemplary embodiments thereof, as illustrated in the accompanying drawings, in which:

FIG. 2 is a partial cross-sectional view taken along line 2—2 of FIG. 1, illustrating the fluid vent in the fill tube structure.

FIG. 3 is an enlarged view of the portion of the circuit card assembly of FIG. 1 which is enclosed by circle 3 of FIG. 1.

FIG. 4 is a plan view of the circuit card configuration of FIG. 1, taken along line 4—4 of FIG. 1.

FIG. 5 is a cross-sectional view taken along line 5—5 of FIG. 4 illustrating the position registering pin for rotational and stacking alignment of adjacent circuit cards.

FIG. 6 is an enlarged view of the structure within circle 6 of FIG. 1 illustrating the relative positioning of the elastomeric connector and the adjacent circuit cards.

FIG. 7 is a perspective, partially broken-away view of a fine line elastomeric connector as employed in the assembly of FIG. 1 (also shown in FIG. 6).

FIG. 8A is a broken-away top view of a circuit card illustrating the conductive pads formed along the periphery thereof.

FIG. 9 is an exploded perspective view of an alternate embodiment of the invention, particularly adapted for very high "G" applications.

FIG. 10 is a perspective broken-away section view of the periphery of one circuit card of the assembly of FIG. 9 enclosed within circle 10, illustrating a feed through connection.

FIG. 13 is a perspective view illustrating the embodiment of FIG. 9 in a fully assembled condition.

FIG. 14 is a perspective, partially broken-away view of a second alternate circuit configuration embodying the invention.

FIG. 15 is a perspective, partially broken-away view of one layer of the embodiment of FIG. 14.

FIG. 16 is an exploded cross-sectional view of an outer edge of one circuit card of the embodiment of FIG. 14, illustrating the engagement of the card periphery with the outer ring-like spacers.

FIG. 17 is a partially broken-away, cross-sectional view of the embodiment of FIG. 14, illustrating the inner ring support arrangement.

FIG. 18 is an exploded perspective view illustrative of a new guided vehicle configuration.

FIG. 19 is a perspective view of the guided vehicle configuration of FIG. 18, shown in assembled form.

DETAILED DESCRIPTION OF THE PREFERRED EMBODIMENTS

Figure 1:
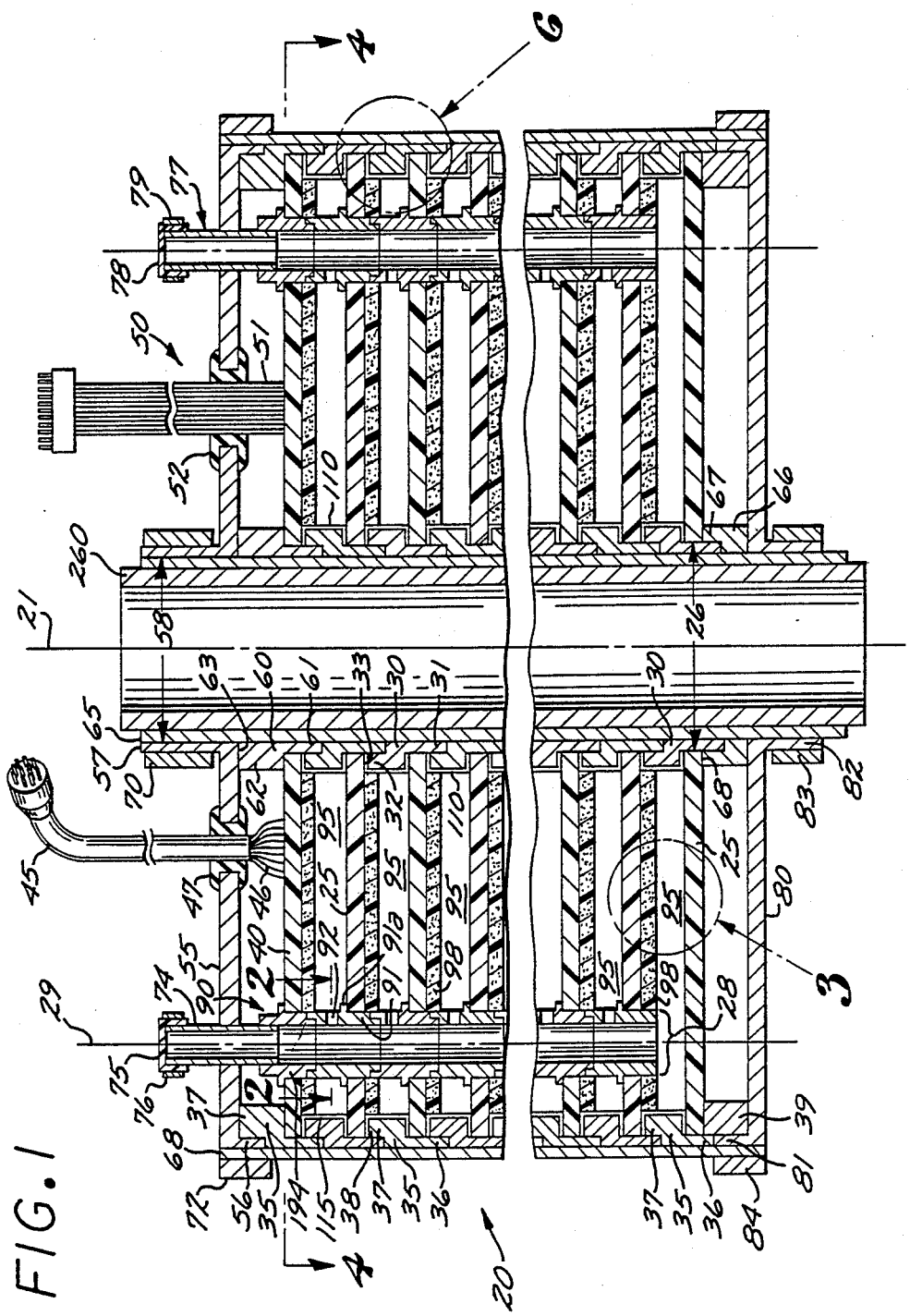
FIG. 1 is a simplified cross-sectional view of a preferred embodiment of a stacked circuit card configuration embodying the invention, utilizing shaped memory alloy closure rings to effect a hermetic seal around the circuit card stack to contain an inert coolant fluid.

One embodiment of the circuit card configuration comprising the invention is disclosed in the length-wise cross-sectional view of FIG. 1. In this configuration, a plurality of circular, planar circuit cards 25 are arranged in a close-packed parallel relationship within the assembly 20. The circuit cards may be comprised of substrates fabricated from polymer/fiber composite materials to provide a lightweight structure with high strength and rigidity. Another possible choice for the circuit card substrates would be a ceramic. In either case, multilayer fine line metallic traces are incorporated along with surface mounted components to allow high component density. The actual material will depend on the requirements of a particular application.

Each circuit card 25 has a circular opening 26 formed therein in alignment with the center axis 21 of the assembly. The inner peripheral edges defining the respective opening 26 in each card 25 are supported by inner spacer or ring-like elements 30 which stack together to form a hollow tubular inner structural support. The outer peripheral edges of the circuit cards 25 are supported by outer spacer elements 35 which stack together to form a hollow tubular outer structural support. The peripheral shapes of the spacer elements 30, 35 are depicted as circular to match the respective inner and outer peripheral configurations of the circuit cards. While the assembly 20 is depicted as cylindrical and comprising elements having a circular configuration, other configurations may be employed as well, such as square circuit cards and spacers, or the assembly may have a conical configuration.

As is apparent from FIG. 1, each inner spacer element 30 is a unitary element comprising an interior ring region 31 having a diameter appropriately sized to fit within the opening 26 in the circuit card. The spacer element 30 further comprises an anterior ring region 32 having a diameter sufficiently greater than the diameter of the opening 26 so that the edge 33 of the spacer 30 contacts and supports the underside edge of the adjacent circuit card.

The outer spacer or ring-like element 35 is also a unitary element, comprising an exterior ring region 36 whose diameter is sufficiently larger than the diameter of the circuit cards 25 to encircle the outer peripheral edge of the circuit card 25. The outer spacer element 35 further comprises an inner ring region 37 whose diameter is smaller than the outer ring region 36 so that the edge 38 contacts and supports the underside of the adjacent circuit card at its outer edge.

The inner and outer spacer elements 30 and 35 may be fabricated from an electrically insulating material such as a thermoplastic. The material may be selected for a particular application such that its dielectric constant enhances the signal propagation through the connectors.

A termination card 40 is disposed adjacent the topmost one of the circuit cards 25 comprising the card assembly 20. While FIG. 1 shows only one termination card 40 at the top of the card stack, for some applications a termination card may be required at each end of the card assembly, dependent upon the electrical connections to the assembly 20 for the particular application. The termination card 40 comprises a means for making electrical connections between externally supplied electrical lines, such as the lines 46 comprising the cable bundle 45 or the lines 51 comprising flat cable 50, to the circuit cards 25. The electrical lines 46 or 51 may be secured to terminals or conductive elements on the termination card by conventional techniques, such as wave-soldering. The means for electrically interconnecting the respective cards 25 and 40 further comprises a plurality of finelined elastomeric connectors 110 and 115.

The circuit card assembly 20 further comprises upper and lower cover plates 55 and 80 which enclose the upper and lower ends of the assembly 20. The cover plate 55 comprises a downwardly extending outer lip 56 which fits outside the inner ring region 37 of the topmost outer spacer element 35. The cover plate 55 further comprises an upwardly extending inner lip 57 defining the opening 58. The inner peripheral edge of the cover plate 55 surrounding opening 58 is supported by an inner spacer element 60. The spacer element 60 is a unitary element comprising an inner ring region 61 whose diameter is slightly smaller than that of the opening 26 formed in the circuit cards 25 so as to be received therein. Because there are no additional inner spacer elements to nest within the upper region of spacer 60, its construction differs from spacer elements 30 in that the outer ring region 62 has an inner diameter equalling the diameter of the opening 58 formed in the cover plate 55 and a somewhat larger outer diameter, providing an upper surface 63 to support the inner periphery of the cover plate 55.

Lower cover plate 80 comprises a circular plate member having an outer, upwardly extending lip 81 and an inner, downwardly extending lip 82. The inner diameter of the outer lip 81 is substantially equal to the outer diameter of the circuit cards 25. A circular outer spacer ring 39 is disposed between the lower cover plate 80 and the lowermost one of the cards 25, supporting the outer periphery of the card. A circular, inner ring-like spacer element 66 is disposed between the cover plate 80 and the lowermost card 25 so that edge 68 spaces and supports the inner peripherial edge of the card. The spacer element 66 dovetails with the adjacent spacer element 30.

The cable bundle 45 and flat ribbon cable 50 are passed through openings formed in the top cover plate 55, and the interface areas 47 and 52 are potted or sealed to prevent leakage of the coolant liquid from the assembly, which is described in further detail below.

The assembly 20 further includes cylindrical inner tubular element 65 and outer tubular element 68, which preferably comprise thin metallic skins. Inner and outer shape-memory-alloy rings 70 and 72 are respectively fitted around the outer periphery of the lip 57 of the cover plate 55 and the outer tubular element 68, and contract to hermetically seal the annular region between the inner and outer tube elements 65 and 68 at the top cover plate 55. In a similar fashion, inner and outer shape-memory-alloy rings 83 and 84 are respectively fitted around the outer periphery of the lip 82 of the cover plate 80 and around the outer tubular element 68, and contract to hermetically seal the annular region between the inner and outer tube elements 65 and 68 at the lower cover plate 80.

Shape-memory-alloys are presently used to make leak-tight hydraulic seals on aircraft and ships. In general, if a shape-memory-alloy material is mechanically deformed while below a specific temperature, the metal will return to a predetermined shape as the temperature is raised. The shape memory is the result of a change in the crystal structure known as a reversible austenite to martensite phase transformation. The shape change occurs at a unique transformation temperature determined by the alloy composition. If the material is subsequently cooled, the shape change is not automatically reversed. One commercial supplier of shape-memory-alloys suitable for the present purpose is Raychem Incorporated, Menlo Park, Calif. For the embodiment illustrated in FIG. 1, the shape-memory-alloy is preferably selected such that the rings 70, 72, 83 and 84 may be installed when at room temperature, and then shrink to form the hermetic seal as the rings are warmed by resistance heating to a predetermined temperature.

One purpose of the hermetic seal formed between the upper and lower cover plates and the inner and outer tubular members is to provide a means for containing a coolant liquid within the circuit card assembly 20. Thus, with the assembly 20 becoming a sealed unit, the spaces between the adjacent circuit cards 25 and the termination card 40 may then be filled with an inert fluorocarbon liquid with a high boiling point. The liquid surrounds the electrical components mounted on the circuit cards, providing cooling by both conduction and convection in a uniform manner. Exemplary liquids suitable for the purpose are the "Fluorinert" TM electronic liquids marketed by the Commercial Chemicals Division of the 3M Company, 223-65E, 3M Center, St. Paul, Minn, 55144. Such liquids have two-thirds the density of aluminum, commonly used as a heat sink, and a 20% higher heat capacity. Further, the liquid drains cleanly, leaving substantially no residue and evaporates quickly. Thus, if necessary, a sealed unit may be drained and immediately disassembled without requiring cleaning or drying procedures.

The unit 20 is filled with liquid through fill port 74, with purge port 77 exhausting the atmospheric gases within the unit as it fills with liquid. The ports 74 and 77 may then be sealed with caps 75 and 78 secured by shape-memory-alloy seal rings 76 and 79.

To allow the liquid to fill the spaces between the respective cards comprising the assembly 20, the cards 25 and 40 further contains circular openings 28 offset from the central opening 26. The cards are aligned such that the respective openings 28 in the cards 25 and 40 are aligned with a common axis 29. A plurality of fill tube elements 91 (one for each card 25) are respectively inserted within the opening 28 of a particular card 25. The elements 91 cooperatively engage with adjacent fill tube elements and with element 94 inserted in the opening 28 in the termination card 40 to form a ported fill tube structure 90.

Each element 91 is a unitary tubular element having a circular outer periphery with a diameter slightly smaller than that of the opening 28, so that the elements 91 may be received within the openings 28. A position registering lip 91a is formed on the outer periphery of each element 91 to define the depth of insertion of element 91 into the opening 28. As shown in the partial cross-sectional view of FIG. 2, ports 92 are formed in the elements 91 to allow the fluid to flow from the tubular fill tube structure 90 into the spaces 95 between adjacent cards 25 and 40. If there is no need for the cooling due to the particular component population on a particular card, then the particular element 91 may be fabricated without a port 92. Also, as shown in FIG. 1, no liquid ports are provided for the space between the upper cover plate 55 and the termination plate 40, since typically there will be no electrical components mounted on the termination board 40. Similarly, coolant liquid will typically not be disposed in the space between the lower cover plate 80 and the lowest card in the card stack, unless components are mounted on the underside surface of that card. Thus, typically no opening 28 need be formed in the lowest card in the stack.

The purge tube 78 communicates with the respective inter-card spaces via a ported tubular structure similar to the fill tubular structure 90. The purge tubular structure facilitates the filling of the assembly 20 with coolant liquid.

Each of the cards 25 is populated with a plurality of electrical components, such as integrated circuit chips, capacitors, resistors and the like (not shown in FIG. 1). For the embodiment of FIGS. 1-8, the circuit cards are populated only on one side of the card, although some applications may require component populations on both sides of the cards. The cards comprise conductive lead patterns to provide electric connection between the components on a card. The circuit cards 25 may employ conventional multilayer circuit card technology as well to increase the lead and component density.

A further aspect of the invention is the provision of a layer 98 of closed cell foam against the lower, unpopulated side of each card 25 and 40. The foam layer 98 serves to reduce the open volume of the spaces 95 between adjacent cards to be filled with the coolant liquid, and is sufficiently resilient to be compressable as the coolant liquid expands as its temperature rises. The thickness of the foam layer 95 is dependent on the cooling requirements for the assembly 20 and the particular cooling requirements for a particular card 25. Thus, the thickness of the layer may vary from circuit card to circuit card within a particular assembly 20, and may even vary across the extent of a particular layer. Thus, if one area of a circuit card is more densely populated with heat producing components, the adjacent portion of the foam layer may be removed or at least made thinner than the thickness of the foam layer adjacent other circuit card regions.

This feature of the invention is further illustrated in the enlarged cross-sectional view of FIG. 3, showing typical adjacent cards 25a and 25b populated with various electrical components referred to generally by reference numerals 102. A foam layer 98a is secured to the nonpopulated side of card 25a. The coolant liquid 100 fills the space 95 between the foam layer 98a and is in direct contact with the board 25b and the components 102 mounted thereon, conducting heat away from the card surface and the components 102. As shown in FIG. 3, the thickness of the foam layers may be non-uniform if required for increased cooling of adjacent electrical components. For example, a relieved region 99 is formed in layer 98a, increasing the available coolant liquid volume in this region.

The particular configuration of the various layers 98 of the assembly is dependent upon the particular application. In general, it is desirable to minimize the volume of coolant liquid carried within assembly 20, since the fluid adds to the weight of the assembly. Hence, the lower the cooling load of the assembly 20, the greater may be the thickness of the foam layers 98.

In the disclosed embodiment, the layers 98 are preferably fabricated from a closed cell polymeric foam material, such that the fluid is not absorbed within the cells of the foam material. The material should be resilient to provide thermal expansion space for the coolant fluid, but stiff enough not to sag when the assembly is placed on its side, i.e., with axis 21 in a horizontal orientation. The layers 98 may be cut from a sheet of the foam material in the desired planar outline, e.g., shaped to the planar configuration of the respective circuit card, and then bonded to the non-populated side of the respective card.

It is contemplated that the assembly 20 will be employed in applications for which the ports 74 and 77 will be sealed after the coolant is loaded to provide a passive coolant system. For example, if the circuit assembly 20 comprises the electronics guidance section of a missile, the passive coolant system may be designed to accommodate the cooling requirements of the electronics package for times in excess of thirty minutes. For testing and "burn-in" of the electronics package, the assembly is well suited to connection to an active coolant circulation device to provide the necessary cooling of the assembly 20 and its electrical components over extended periods of operation. The fill and purge ports 74 and 77 may be coupled to the coolant fluid circulation device to actively circulate the coolant fluid during extended operation of the electrical circuits comprising assembly 20, e.g., during testing.

The rotational alignment as well as the stacking order of the circuit cards 25 and 40 is keyed by the engagement of respective key pins 85 set into each card into keying caps 89 located in the next adjacent card. This feature is illustrated in FIGS. 4 and 5. Thus, pin 85 comprises a center post 86 which fits into opening 87 formed in the particular card (referred to in FIG. 5 as card 25c). The card 25d to be stacked above card 25c has a corresponding larger diameter opening 88 formed in alignment with the center axis 87a of the opening 87 in card 25c. The inserted pin 85 extends above the surface of card 25a by a distance greater than the inter-card spacing. If the correct card 25d is stacked above the board 25c in the proper rotational alignment, the pin 85 is received within the cap 89 fitted within the opening 88 formed in card 25d. In a similar fashion, the board 25d is fitted with its own key pin (not shown) offset from the position of the pin 85, to be received within the appropriately located cap placed in the next successive card in the card stack. This is depicted in FIG. 4, wherein two caps 89a, 89b disposed in two underlying circuit cards are depicted in phantom lines, and the cap 89 of the top card is indicated in solid lines. Thus, not only are the positions of the cards rotationally aligned, but the relative positions of the cards within each stack are keyed to ensure proper assembly.

A plurality of fine line elastomeric connectors is employed to provide electrical connection between the respective adjacent cards 25 and between the topmost one of the circuit cards 25 and the termination card 40. As illustrated in FIGS. 1, 6 and 7, respective inner and outer connectors 110 and 115 are circular members with "C" shaped cross-sectional configurations. FIG. 7 is a partial broken-away perspective view of the outer connector 115; the inner conductor 110 has a similar configuration except its curvature is in the opposite direction.

Respective inner connectors 110 fit on the outward side of the outer ring regions 32 of the inner spacer element 30, and the outer ring region 37 of element 35. The conductive lines are applied on the external surfaces of the connector, such that when the connector is assemblied in the card stack, the conductive lines on the lower and upper legs 116 and 117 of the connector contact the adjacent respective sides of the adjacent boards. The legs 116 and 117 are bowed outwardly such that, as the connector is assembled and the bowed legs are compressed to a flattened state, a slight wiping motion occurs between the card surfaces and the conductive lines to ensure good electrical contact.

Metal-on-elastomer connectors are in widespread use today. Such connectors comprise metallic conducting paths laminated to electrically insulating elastomers, such as silicone. The conductive paths may comprise such conductive metals as gold, copper or nickel. The metal-on-elastomer connectors are available with as many as 500 or more conductive paths per inch. One exemplary commercial supplier of metal-on-elastomer connectors is Pick Elastomerics, Inc., 333 Byberry Road, Hatboro, Pa. 19040.

The respective connectors 110, 115 provide electrical continuity between aligned conductive pads 120 which are imprinted on the respective adjacent upper and lower surfaces of the adjacent cards. Exemplary pads 120 are shown in the enlarged partial top view of FIG. 8A, illustrating the pads formed adjacent the periphery of termination card 40. To illustrate the large number of conductive pads which may be formed at the outer periphery of a circuit or termination card, some exemplary pad and card dimensions may be analyzed. If the pad width is 0.050 inches, the center-to-center pad spacing is 0.075 inches, and the card diameter is 7.6 inches there is ample room to fit 300 conductive pads at the outer periphery of the card. This is considered a conservative number, since the pad width and spacing could readily be reduced. Thus, quite a large number of possible connections are available to connect between cards in contrast to conventional circuit card configurations employing standard pin connectors. Conductive pads are also formed around the inner peripheral edges of the cards surrounding the inner opening 28.

The pads are formed on both the upper and lower sides of each card 25. Plated-through hole connections and/or multi-layer connections may be employed to electrically connect a particular pad to other circuitry on the card and/or to a corresponding pad on the opposite side of the circuit card. FIG. 6 illustrates the electrical contact achieved by interconnection of the elastomeric connector and the pads of the adjacent circuit cards. Card 25e has conductive pads 120a and 120b formed on opposite sides of the card adjacent the outer peripheral edge. A via opening 121 is formed through the card and plated through to electrically connect the pads 120a and 120b.

Still referring to FIG. 6, circuit card 25f has conductive pads 120c and 120d formed on opposite sides of the card. Card 25f is a simplified depiction of a multilayer circuit card. As is well known to those skilled in the art, such cards have a plurality of thin substrate layers, each carrying a particular conductive path pattern typically formed by photolithographic techniques. By way of illustration, card 25f is shown with a first conductive path or lead 122a at a first interior card layer, sandwiched between adjacent insulating substrate layers 124a and 124b, and a second conductive path or lead 123a at a second interior card layer also sandwiched between adjacent insulating substrate layers 124b and 124c. A via opening 122b is formed in the card between the pad 120c and the conductive lead 122a, and is plated through to electrically connect the pad 120c and the lead 122a. In a similar fashion, via opening 123b is formed in the card 25f between the pad 120d and conductive lead 123a and is plated through to electrically connect the pad 120d and the lead 123a.

The leads 122a and 123a may be respectively coupled to other electrical components (not shown) on the card 25f. Of course, it will be understood that the particular connections made between the cards and to particular circuits on the card is dependent on the particular application and its electrical circuits.

The fine line elastomeric connector 115 electrically connects pads 120b on card 25e and pad 120c on card 25f through mechanical contact of certain of the fine conductive lines 118 formed on the outwardly-facing surface of the connector. The inner elastomeric connector 110 provides electrical continuity between conductive pads formed adjacent the inner peripheral edges of the circuit card in a similar fashion to that described for the outer connector 115. The circumference of the inner periphery of the card surrounding the opening 26 is, of course, substantially smaller than the circumference about the card's outer periphery. Hence, the number of conductive pads which may be placed along the inner periphery is much smaller than the number about the outer periphery.

One advantage of the card configuration depicted in FIGS. 1–8 is that the rotational position of the respective conductors 110 and 115 need not be keyed to the rotational alignment of the cards 25 and 40. The connectors simply make connection between conductive surfaces in vertical (i.e., as represented by the alignment of axis 21) alignment with one another. Moreover, the required tolerance in the rotational alignment of the adjacent cards is minimized, since the pad width is much larger than the line width on the connector so that a plurality of fine lines are available to contact the appropriate pads.

Figure 8B:
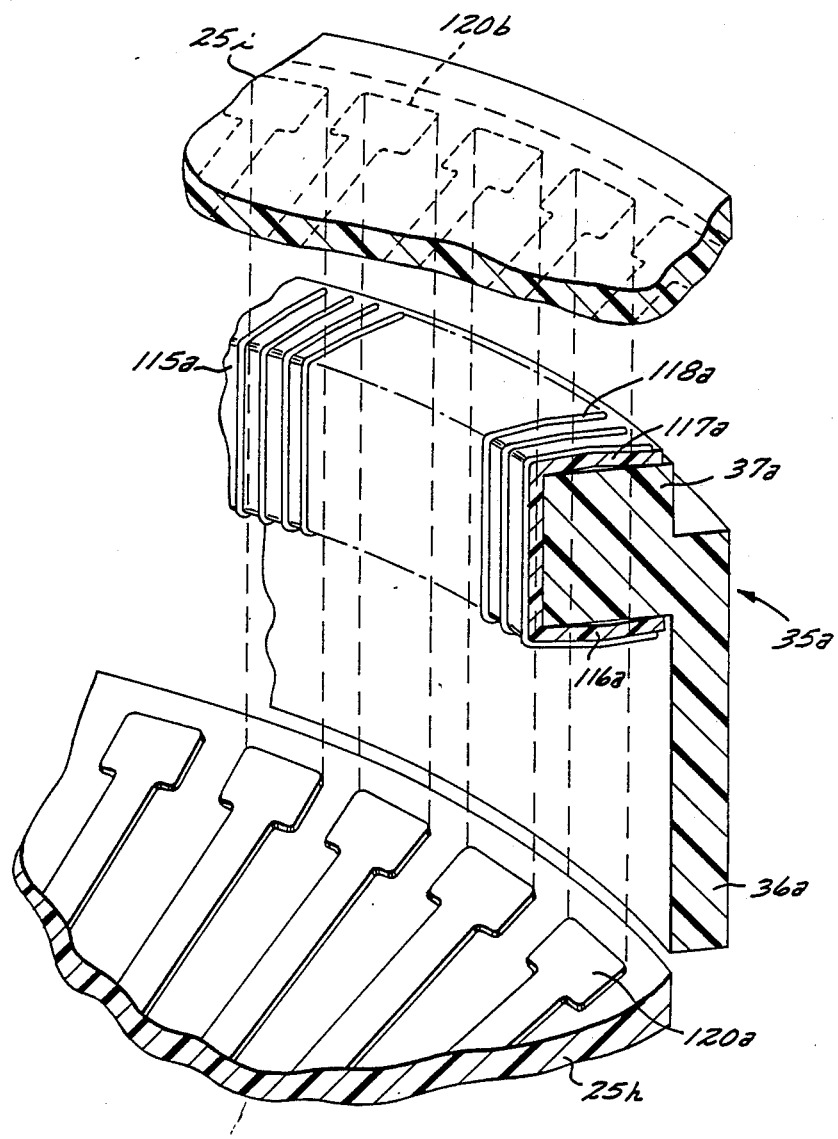
FIG. 8B is an exploded perspective view of portions of two adjacent circuit boards, a metal-on-elastomer connector and an outer spacer element.

The contact of the connector lines with pads on the adjacent surfaces of circuit cards is illustrated in the exploded perspective view of FIG. 8B. Here, cards 25h and 25i comprise adjacent surfaces on which a plurality of respective pads 120a and 120b are formed. The outer metal-on-elastomer connector 115a is assembled with the outer spacer ring 35a fitted over the inward portion of region 37a. When the cards 25h and 25i are assembled, their rotational alignment will be keyed, as described above, such that corresponding ones of the pads 120a will be in vertical alignment (i.e., in parallel alignment with center axis 21 of FIG. 1). The connector 115a need not be rotationally keyed with the adjacent cards. A plurality of the lines 118a running radially outwardly along the lower leg 116a of the connector 115a connect each pad 120a of card 25h. Similarly, a plurality of the lines 118a running radially outwardly along the upper leg 117a of the connector 115a contact each pad 120b of card 25i. Thus, a plurality of conductive lines 118a electrically connects each aligned pair of pads 120a and 120b. Moreover, because the line spacing on the connector 115a can be made quite small in relation to the width of each pad, there is a substantial tolerance against rotational card misalignment.

Another aspect of the invention is the separation of the power and signal lines within the assembly 20. The power lines for supplying power to the electrical circuitry comprising the assembly 20 may be placed along the inner periphery of the card stack, i.e., through the inner connectors 110 and the appropriate conductor pads adjacent the inner peripheral edges of the cards 25. The signal lines carrying the time varying signals may be conducted from card to card (as appropriate for the particular assembly) via the outer connectors 115 and the appropriate conductor pads adjacent the outer peripheral edge of the cards. The separation between the power and signal lines results in improved isolation and reduced crosstalk between time varying signals and power lines.

Referring now to FIG. 9, another embodiment of a card assembly embodying the invention is shown. This embodiment is particularly adapted to applications wherein the circuit card assembly will be subjected to extremely high "G" forces, e.g., in excess of 100,000 G's. Assembly 150 comprises a plurality of ceramic circuit cards 155 and ceramic spacer cards 160. The circuit cards 160 are populated on one side with a plurality of electrical components 156. The spacer card 160 adjacent the populated surface of the circuit card 155 includes cutout openings 161 which match the size and location of the electrical components 156 on the circuit card 155 so that the respective cards 155 and 160 fit together in intimate contact. Each of the populated circuit cards 155 is matched with a corresponding spacer card 160. Each circuit card 155 and spacer card 160 is formed with a central opening 157, 162 formed therein.

Each ceramic card 155 may comprise a ceramic substrate layer with thin film multilayer interconnections. Each card 155 and the spacer cards are interconnected by the feedthrough contacts 165 fitted through holes formed in the inner and outer periphery of the respective cards. FIG. 10 shows a breakaway view of the periphery of a circuit card 155 illustrating an exemplary feedthrough 165.

External electrical connection is made to the assembly 150 via flat ribbon cables 180 and 182. The individual conductive lines comprising the cables 180 and 182 are in turn coupled to respective ones of the feedthrough elements of the end cards 164, 165 comprising the assembly 150. The cables 180, 182 are respectively connected to flat, flexible connector sheets 185, 187 bearing a conductive lead pattern, which are respectively disposed between the termination plates 190, 191 and the end cards 164 and 167 such that conductive pads on the inner and outer peripheries of the layer contact the respective feedthrough elements disposed around the adjacent peripheral edges.

Figure 11:
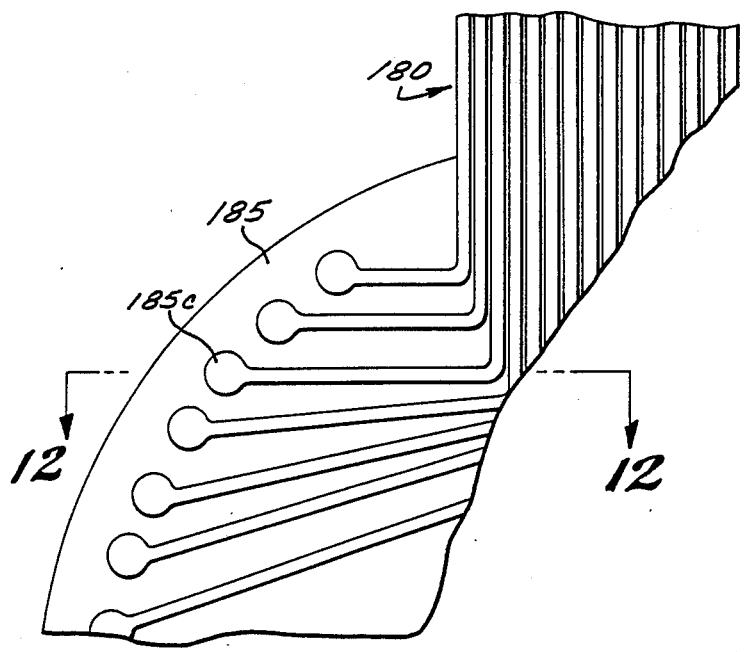
FIG. 11 is a partial top plan view of a flexible connector sheet employed to provide electrical connection to the circuit cards comprising the embodiment of FIG. 9.
Figure 12:
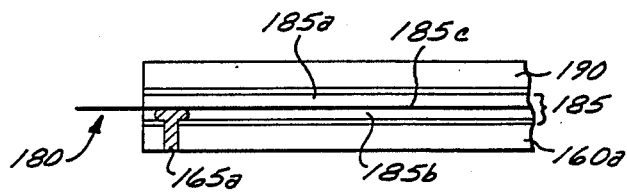
FIG. 12 is a partial cross-sectional view of the connector sheet of FIG. 11.

Connector sheet 185 is shown in further detail in FIGS. 11 and 12. The outer peripheral configuration of the sheet 185 is circular to match that of the cards 155 and spacers 160. The sheet comprises first and second layers 185a, 185b of flexible insulating material, such as polymide film, which sandwich copper conductive traces 185c. The layer 185a is relieved at areas around the outer periphery to allow the respective traces 185c to be soldered to corresponding feedthrough elements 165a of the adjacent spacer card 160a. Thus, corresponding ones of the traces 185c are electrically connected to the feedthrough elements 165a to provide electrical connection to the unit 150.

The termination plates 190 and 191 comprise molybdenum compression plates fitted at the ends of the card and spacer stack. A plurality of high tensile strength bolts 175 are inserted through aligned openings formed in each of the circuit cards 155 and spacers 160, and are secured by fasteners 177. The fasteners are tightened down so as to exert a high compression preload force on the respective end plates, which is transmitted through to compress the cards 155 and spacers 160. The preload force exerted on the assembly 150 by the fastener elements 175, 177 is as high or higher than the deceleration force applied to the cards during operation so that the cards do not experience any tensile forces. The ceramic substrates comprising the cards 155 and the spacers 160 are brittle and might crack or break as a result of any applied tensile forces.

As the assembly 150 is brought into compression by the fasteners, the aligned feedthrough elements 165 of adjacent cards 155 and spacers 160 are brought into contact, thereby making electrical connection. FIG. 13 illustrates in perspective view the fully assembled unit 150. As described with respect to the embodiment of FIGS. 1–8, the feedthrough elements 165 may pass directly through the cards 155, or may make intermediate connection to one or more of the multiple layers in a particular card 155. The feedthrough elements for the spacers 160 will typically comprise direct feedthrough elements. As with the embodiment of FIGS. 1–8, connector elements are provided adjacent the outer periphery of the cards 155 and spacers 160 and the inner peripheral edge as well. Thus, separation between power lines and signal lines may be achieved with this embodiment as well.

Referring now to FIGS. 14–17, another circuit configuration embodying the invention is disclosed. As with the embodiments already described, assembly 200 comprises a plurality of stacked circular circuit cards 205 each having a center opening 206 formed therein in alignment with the center axis 201 of the unit. A pair of outer support rings 216 and 217 is provided for each circuit card 205 to provide support for the outer peripheral edges of the card. An inner support ring 220 is provided to support the inner peripheral edge adjacent the opening 206 in the card. The inner and outer support rings are adapted to nest together with corresponding adjacent rings in the card stack.

In the embodiment of FIGS. 14–17, electrical continuity between adjacent cards is achieved by the conductive paths applied directly to the inner and outer support rings 216, 217 and 220. The conductive paths may be applied by electrodeposition on the insulative material comprising the rings, or by other suitable technique well known in the circuit industry. The conductive paths comprise a plurality of fine lines extending generally in alignment with the central axis of the assembly. The conductive paths make contact with conductive pads formed on the inner and outer peripheries of the circuit cards, as described with respect to the embodiment shown in FIGS. 1–8, once the card stack is fully assembled.

FIG. 16 is an exploded cross-sectional view of the outer edge of a card 205 and the associated pairs of outer rings 216a, 217a and 216b, 217b. This view depicts card 205 as having conductive traces or pads formed on the upper and lower surfaces thereof. Thus, conductive trace 211 is formed on the upper surface of the card 205, and trace 212 is formed on the lower side of the card. Corresponding traces are formed in the respective rings 216a, 217a, 216b, 217b and are aligned with corresponding ones of the card traces to achieve electrical contact. The upper rings 216a and 217a are secured to card 205 by soldering at the respective junctures of the conductive traces on the card 205 and the rings. The corresponding inner ring 220 (not shown in FIG. 16) is also secured to the card 205 to form the assembly layer 215 depicted in FIG. 15. As shown in FIG. 16, the card edge is formed with downwardly extending pointed ridges 208, 207 which dovetail with V-shaped grooves formed in the rings 216b and 217b. A feedthrough 211a electrically connects a trace formed on the V-shaped groove of ring 216b to conductive trace 211 on the top of card 205. A trace formed on the V-shaped groove of ring 217b connects with trace 212 on the lower side of card 205.

The card 205 may employ multilayer circuit board technology. Moreover, the cards 205 may be fabricated from materials such as a high tensile modulus graphite epoxy composite for high strength. Two outer rings 216, 217 are shown to provide an increased number of circuit connections over those available if only a single outer ring were employed.

FIG. 17 illustrates in cross-section typical cards 205a and 205b in the stacking configuration with inner rings 220a, 220b and 220c. As with the outer rings 216, 217, conductive traces are formed on the inner rings 220 and are brought into contact with corresponding traces on the cards 205a, 205b and the adjacent rings.

The signal lines and power lines for this third embodiment may also be separated with the inter-card power connections made by power lines arranged along the inner rings 220, and the inter-card signal connections made by signal lines arranged along the two outer rings 216, 217. The number of rings, either at the inner or outer periphery of the cards, are determined according to the number of interconnections required for the particular application and may vary from layer to layer within a particular assembly. For example, in a missile electronics unit, the number of outer rings carrying the signal lines may be increased for the computer card, the memory card and the input/output cards because of the large number of interconnections between these cards. Other cards in the assembly requiring fewer interconnections would have fewer rings.

The outermost ring in the assembly could also be used, again for a missile application, to provide interconnections between the front and the aft end of the electronics unit. These interconnections could be separated from or connected to the cards in the unit as required.

The outer rings comprise semicircular interlocking regions 230 which key the relative rotational position of the cards, allowing a simple means for proper integration of the various cards into a completed assembly.

A novel circuit card configuration has been disclosed. The advantages of the new configuration include the following:

1. Elimination of standard pin connectors reduces the assembly and integration time of the unit as well as the cost.
2. The configuration lends itself to automated or robotic assembly and testing which should significantly reduce assembly and testing costs.
3. The use of light weight materials for the spacer elements, such as polymer/fiber composites, provides an assembly whose strength and stiffness is several times that of steel while weighing up to one-third less than steel. These attributes of polymer/fiber composite materials are particularly important advantages when the assembly is to be used in a high G application.
4. Each card can be keyed for correct interfacing to the next card, allowing a simple means for integration of the various cards into a completed assembly.
5. The cards can be tested individually or in any sequential combination since all electrical lines are readily accessible.
6. Separation of the power and signal lines should improve isolation and reduce crosstalk between signals and power.
7. The location of the power lines at the center of the cards and the signal lines on the outside edges of the circuit card provides an improvement in the layout and partitioning of the electrical components on the card. Additionally, input and output signal lines could be separated to further improve the isolation between signals, since these signal lines are not confined to particular areas as is the case when using standard pin connectors.

The circuit card configurations described above are advantageously used as guidance electronics units for guided vehicles, such as missiles, torpedos or re-entry vehicles. The card configurations may be employed with the novel vehicle configuration shown in FIGS. 18 and 19.

For purposes of illustration, FIGS. 18 and 19 depict a guided missile configuration. It is to be understood that this facet of the invention is not limited to missiles, but is in general applicable to guided vehicles, including guided missiles, torpedos, re-entry vehicles and the like.

The missile 250 comprises the aft missile body 255, carrying, for example, the missile propelling apparatus. Extending forwardly along the central axis 252 of body 255 is a central tubular support element 260.

The guidance electronics unit 265 preferably comprises one of the circuit card configurations described hereinabove with respect to FIGS. 1-17, and is assembled with the tubular element 260 extending through the central opening formed in the unit 265. By way of example, the tubular member 260 is also shown in FIG. 1 in the inserted position. Tubular outer structural member 275 is fitted about the unit 265 to form the forward outer missile body.

A sensor assembly 280 is secured to the tubular element 260 and comprises a radome structure 295, a reflector dish 290, and a dish platform 285. The dish platform 285 comprises a central opening 286 which receives the tubular member 260. A fastener 262 is threadingly received on tubular member 260 to secure the platform 285 in compression against the body 275, unit 265 and aft body 255. The dish 290 and radome 295 are secured to the platform 285. As will be apparent to those skilled in the art, the reflector dish 290 is conventionally coupled to the platform 285 by a gimball arrangement (not shown) to allow movement of the reflector in relation to the platform 285.

The missile configuration shown in FIGS. 18 and 19 further includes a means for keying the rotational alignment of various elements of the missile as it is assembled. This means comprises the protruding regions 277 and 287 formed in the respective outer cover member 275 and the platform 285, which regions engage in corresponding relieved areas 257 and 276 formed in the outer surface of the aft missile body 255 and the outer cover element 275. As the various elements of the missile are assembled, the elements are rotationally aligned to allow regions 277 and 287 to engage in areas 257 and 276.

The missile configuration shown in FIG. 18 solves the problem of alignment of the platform 285 with the surface 256 comprising the aft body 255. In order to achieve accurate guidance of the missile, the boresight of the sensor platform 285 is conventionally aligned in a predetermined relationship with the aft body 255. Typically, the alignment may comprise securing the platform 285 such that it is in exact parallel alignment with planar surface 256 of the aft body. The alignment is provided very simply with the disclosed configuration, by tightening down the fastener 262 to secure the various elements shown in FIG. 18.

The platform 285 abuts the adjacent forward end of the cover 275, with the aft end of the cover abutting surface 256, as the fastener is secured. As the elements 255, 265, 275 and 285 are brought together by the compression forces of the fastener on the forward end and the surface 256 on the aft end, the alignment of the plane defined by the platform 285 will be determined by the alignment of the ends of the tubular structural member 275. If the respective ends of the member 275 define planes perpendicularly intersecting the center axis 252, then the platform 285 will be aligned with the plane 256 of the aft body. As will be appreciated by those skilled in the art, for certain applications it may be desirable to reverse the configuration of FIG. 18, such that the tubular support member extends from a forward section of the vehicle toward the aft portion of the vehicle.

The tubular outer structural member 275 is sufficiently rigid so as to provide an outer cover, as well as to withstand the compression forces exerted by the operation of the fastener 262. The members 260 and 265 are subjected to tension and compression preload forces which are sufficient to withstand any operational stresses encountered during missile flight.

It is understood that the above-described embodiment is merely illustrative of the possible specific embodiments which may represent principles of the present invention. Other arrangements may be devised in accordance with these principles by those skilled in the art without departing from the scope of the invention.

What is claimed is:

1. A stacked electrical circuit card configuration, comprising:
   a plurality of electrical circuit cards, each having an outer periphery defining the outer edge thereof and an inner periphery defining an inner edge surrounding an interior opening in each circuit card;
   said circuit cards comprising an electrically conductive pattern for electrical connection of electrical components mounted to the card, said conductive pattern comprising a plurality of conductive elements disposed adjacent said outer periphery;
   first support means for supporting said outer periphery of said circuit cards in an aligned relationship;
   second support means for supporting said inner peripheries of said circuit cards in an aligned relationship;
   first interconnection means for selectively electrically connecting predetermined ones of the conductive elements adjacent said outer periphery of adjacent circuit cards; and
   a plurality of key members each key member extending from a respective card, each key member located at a unique location on the card relative to the center axis, and a corresponding key opening formed in the appropriate adjacent card at the appropriate location relative to the center axis of said interior opening, to receive the key member in the adjacent card, so that only one of the plurality of the cards is adapted to be stacked directly above any other card with the key members received in said key opening in said other card.

* * * * *